United States Patent
Chu et al.

(10) Patent No.: US 10,516,137 B2
(45) Date of Patent: Dec. 24, 2019

(54) METHOD OF ENCAPSULATING AN ENVIRONMENTALLY SENSITIVE DEVICE

(71) Applicant: Samsung Display Co., Ltd., Yongin (KR)

(72) Inventors: Xi Chu, Freemont, CA (US); Steve Shi Lin, Sunnyvale, CA (US); Gordon L. Graff, West Richland, WA (US)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/669,216

(22) Filed: Mar. 26, 2015

(65) Prior Publication Data

US 2015/0191000 A1    Jul. 9, 2015

Related U.S. Application Data

(60) Division of application No. 11/627,602, filed on Jan. 26, 2007, now abandoned, which is a (Continued)

(51) Int. Cl.
*H01L 51/52* (2006.01)
*H01L 51/00* (2006.01)
(Continued)

(52) U.S. Cl.
CPC ...... *H01L 51/5256* (2013.01); *B32B 37/0076* (2013.01); *B32B 37/02* (2013.01); *B32B 37/1207* (2013.01); *B32B 38/0004* (2013.01); *B32B 38/10* (2013.01); *H01L 21/568* (2013.01); *H01L 51/0024* (2013.01); *H01L 51/107* (2013.01); *H01L 51/448* (2013.01); *B32B 2037/246* (2013.01); *B32B 2307/546* (2013.01); *B32B 2307/7244* (2013.01);
(Continued)

(58) Field of Classification Search
CPC ............... H01L 21/568; H01L 51/5256; H01L 51/0097; H01L 51/003
See application file for complete search history.

(56) References Cited

U.S. PATENT DOCUMENTS 2,382,432 A    8/1945  McManus et al.
2,384,500 A    9/1945  Stoll
(Continued)

FOREIGN PATENT DOCUMENTS

BE       704297       2/1968
CA     2 353 506      5/2000
(Continued)

OTHER PUBLICATIONS

De Gryse, R. et al., "Sputtered Transparent Barrier Layers," Tenth International Conference on Vacuum Web Coating (Edited by R. Bakish) aka the 10th Bakish Conference; 1996; pp. 190-198.
(Continued)

*Primary Examiner* — Livius R. Cazan
(74) *Attorney, Agent, or Firm* — Dinsmore & Shohl, LLP

(57) ABSTRACT

Methods of encapsulating an environmentally sensitive device. The methods involve temporarily laminating a flexible substrate to a rigid support using a reversible adhesive for processing, reversing the reversible adhesive, and removing the device from the rigid support.

11 Claims, 7 Drawing Sheets

Related U.S. Application Data continuation-in-part of application No. 11/068,356, filed on Feb. 28, 2005, now abandoned, which is a division of application No. 09/966,163, filed on Sep. 28, 2001, now Pat. No. 6,866,901, which is a continuation-in-part of application No. 09/427,136, filed on Oct. 25, 1999, now Pat. No. 6,522,067.

(51) Int. Cl.

| | | |
|---|---|---|
| *H01L 51/10* | (2006.01) | |
| *H01L 51/44* | (2006.01) | |
| *H01L 21/56* | (2006.01) | |
| *B32B 37/00* | (2006.01) | |
| *B32B 37/02* | (2006.01) | |
| *B32B 37/12* | (2006.01) | |
| *B32B 38/00* | (2006.01) | |
| *B32B 38/10* | (2006.01) | |
| *B32B 37/24* | (2006.01) | |

(52) U.S. Cl.
 CPC ... *B32B 2307/7246* (2013.01); *B32B 2457/00* (2013.01); *H01L 2227/326* (2013.01); *H01L 2251/5338* (2013.01); *H01L 2251/566* (2013.01); *Y02E 10/549* (2013.01); *Y10T 428/239* (2015.01)

(56) References Cited

U.S. PATENT DOCUMENTS

| | | |
|---|---|---|
| 3,475,307 A | 10/1969 | Knox et al. |
| 3,496,427 A | 2/1970 | Lee |
| 3,607,365 A | 9/1971 | Lindlof |
| 3,661,117 A | 5/1972 | Cornelius et al. |
| 3,941,630 A | 3/1976 | Larrabee |
| 4,061,835 A | 12/1977 | Poppe et al. |
| 4,098,965 A | 7/1978 | Kinsman |
| 4,266,223 A | 5/1981 | Frame |
| 4,283,482 A | 8/1981 | Hattori et al. |
| 4,313,254 A | 2/1982 | Feldman et al. |
| 4,426,275 A | 1/1984 | Meckel et al. |
| 4,521,458 A | 6/1985 | Nelson |
| 4,537,814 A | 8/1985 | Itoh et al. |
| 4,555,274 A | 11/1985 | Kitajima et al. |
| 4,557,978 A | 12/1985 | Mason |
| 4,572,845 A | 1/1986 | Dietrich et al. |
| 4,581,337 A | 4/1986 | Frey et al. |
| 4,624,867 A | 11/1986 | Iijima et al. |
| 4,690,728 A | 9/1987 | Tsang et al. |
| 4,695,618 A | 9/1987 | Mowrer |
| 4,710,426 A | 12/1987 | Stephens |
| 4,722,515 A | 2/1988 | Ham |
| 4,768,666 A | 9/1988 | Kessler |
| 4,842,893 A | 6/1989 | Yializis et al. |
| 4,843,036 A | 6/1989 | Schmidt et al. |
| 4,855,186 A | 8/1989 | Grolig et al. |
| 4,889,609 A | 12/1989 | Cannella |
| 4,913,090 A | 4/1990 | Harada et al. |
| 4,931,158 A | 6/1990 | Bunshah et al. |
| 4,934,315 A | 6/1990 | Linnebach et al. |
| 4,954,371 A | 9/1990 | Yializis |
| 4,977,013 A | 12/1990 | Ritchie et al. |
| 5,032,461 A | 7/1991 | Shaw et al. |
| 5,036,249 A | 7/1991 | Pike-Biegunski et al. |
| 5,047,131 A | 9/1991 | Wofe et al. |
| 5,059,861 A | 10/1991 | Littman et al. |
| 5,124,204 A | 6/1992 | Yamashita et al. |
| 5,189,405 A | 2/1993 | Yamashita et al. |
| 5,203,898 A | 4/1993 | Carpenter et al. |
| 5,204,314 A | 4/1993 | Kirlin et al. |
| 5,237,439 A | 8/1993 | Misono et al. |
| 5,260,095 A | 11/1993 | Affinito |
| 5,336,324 A | 8/1994 | Stall et al. |
| 5,344,501 A | 9/1994 | Hashimoto et al. |
| 5,354,497 A | 10/1994 | Fukuchi et al. |
| 5,356,947 A | 10/1994 | Ali et al. |
| 5,357,063 A | 10/1994 | House et al. |
| 5,376,467 A | 12/1994 | Takao et al. |
| 5,393,607 A | 2/1995 | Kawasaki et al. |
| 5,395,644 A | 3/1995 | Affinito |
| 5,402,314 A | 3/1995 | Amago et al. |
| 5,427,638 A | 6/1995 | Goetz et al. |
| 5,440,446 A | 8/1995 | Shaw et al. |
| 5,451,449 A | 9/1995 | Shetty et al. |
| 5,461,545 A | 10/1995 | Leroy et al. |
| 5,464,667 A | 11/1995 | Kohler et al. |
| 5,510,173 A | 4/1996 | Pass et al. |
| 5,512,320 A | 4/1996 | Turner et al. |
| 5,536,323 A | 7/1996 | Kirlin et al. |
| 5,547,508 A | 8/1996 | Affinito |
| 5,554,220 A | 9/1996 | Forrest et al. |
| 5,576,101 A | 11/1996 | Saitoh et al. |
| 5,578,141 A | 11/1996 | Mori et al. |
| 5,607,789 A | 3/1997 | Treger et al. |
| 5,620,524 A | 4/1997 | Fan et al. |
| 5,629,389 A | 5/1997 | Roitman et al. |
| 5,652,192 A | 7/1997 | Matson et al. |
| 5,654,084 A | 8/1997 | Egert |
| 5,660,961 A | 8/1997 | Yu |
| 5,665,280 A | 9/1997 | Tropsha |
| 5,681,615 A | 10/1997 | Affinito et al. |
| 5,681,666 A | 10/1997 | Treger et al. |
| 5,684,084 A | 11/1997 | Lewin et al. |
| 5,686,360 A * | 11/1997 | Harvey, III ......... H01L 51/0097 438/126 |
| 5,693,956 A | 12/1997 | Shi et al. |
| 5,695,564 A | 12/1997 | Imahashi |
| 5,711,816 A | 1/1998 | Kirlin et al. |
| 5,725,909 A | 3/1998 | Shaw et al. |
| 5,731,661 A | 3/1998 | So et al. |
| 5,736,207 A | 4/1998 | Walther et al. |
| 5,747,182 A | 5/1998 | Friend et al. |
| 5,757,126 A | 5/1998 | Harvey, III et al. |
| 5,759,329 A | 6/1998 | Krause et al. |
| 5,771,177 A | 6/1998 | Tada et al. |
| 5,771,562 A | 6/1998 | Harvey, III et al. |
| 5,782,355 A | 7/1998 | Katagiri et al. |
| 5,792,550 A | 8/1998 | Phillips et al. |
| 5,795,399 A | 8/1998 | Hasegawa et al. |
| 5,811,177 A | 9/1998 | Shi et al. |
| 5,811,183 A | 9/1998 | Shaw et al. |
| 5,821,138 A | 10/1998 | Yamazaki et al. |
| 5,821,692 A | 10/1998 | Rogers et al. |
| 5,844,363 A | 12/1998 | Gu et al. |
| 5,861,658 A | 1/1999 | Cronin et al. |
| 5,869,791 A | 2/1999 | Young |
| 5,872,355 A | 2/1999 | Hueschen |
| 5,891,554 A | 4/1999 | Hosokawa et al. |
| 5,895,228 A | 4/1999 | Biebuyck et al. |
| 5,902,641 A | 5/1999 | Affinito et al. |
| 5,902,688 A | 5/1999 | Antoniadis et al. |
| 5,904,958 A | 5/1999 | Dick et al. |
| 5,912,069 A | 6/1999 | Yializis et al. |
| 5,919,328 A | 7/1999 | Tropsha et al. |
| 5,920,080 A | 7/1999 | Jones |
| 5,922,161 A | 7/1999 | Wu et al. |
| 5,929,562 A | 7/1999 | Pichler |
| 5,934,856 A | 8/1999 | Asakawa et al. |
| 5,945,174 A | 8/1999 | Shaw et al. |
| 5,948,552 A | 9/1999 | Antoniadis et al. |
| 5,952,778 A | 9/1999 | Haskal et al. |
| 5,955,161 A | 9/1999 | Tropsha |
| 5,965,907 A | 10/1999 | Huang et al. |
| 5,968,620 A | 10/1999 | Harvey et al. |
| 5,994,174 A | 11/1999 | Carey et al. |
| 5,996,498 A | 12/1999 | Lewis |
| 6,004,660 A | 12/1999 | Topolski et al. |
| 6,013,337 A | 1/2000 | Knors |
| 6,040,017 A | 3/2000 | Mikhael et al. |
| 6,045,864 A | 4/2000 | Lyons et al. |
| 6,066,826 A | 5/2000 | Yializis |
| 6,083,313 A | 7/2000 | Venkatraman et al. |
| 6,083,628 A | 7/2000 | Yializis |

(56) References Cited

U.S. PATENT DOCUMENTS

| | | | |
|---|---|---|---|
| 6,084,702 A | 7/2000 | Byker et al. | |
| 6,087,007 A | 7/2000 | Fuji et al. | |
| 6,092,269 A | 7/2000 | Yializis et al. | |
| 6,106,627 A | 8/2000 | Yializis et al. | |
| 6,117,266 A | 9/2000 | Horzel et al. | |
| 6,118,218 A | 9/2000 | Yializis et al. | |
| 6,137,221 A | 10/2000 | Roitman et al. | |
| 6,146,225 A | 11/2000 | Sheates et al. | |
| 6,146,462 A | 11/2000 | Yializis et al. | |
| 6,150,187 A | 11/2000 | Zyung et al. | |
| 6,165,566 A | 12/2000 | Tropsha | |
| 6,178,082 B1 | 1/2001 | Farooq et al. | |
| 6,195,142 B1 | 2/2001 | Gyotoku et al. | |
| 6,198,217 B1 | 3/2001 | Suzuki et al. | |
| 6,198,220 B1 | 3/2001 | Jones et al. | |
| 6,203,898 B1 | 3/2001 | Kohler et al. | |
| 6,207,238 B1 | 3/2001 | Affinito | |
| 6,207,239 B1 | 3/2001 | Affinito | |
| 6,214,422 B1 | 4/2001 | Yializis | |
| 6,217,947 B1 | 4/2001 | Affinito | |
| 6,224,948 B1 | 5/2001 | Affinito | |
| 6,228,434 B1 | 5/2001 | Affinito | |
| 6,228,436 B1 | 5/2001 | Affinito | |
| 6,231,939 B1 | 5/2001 | Shaw et al. | |
| 6,264,747 B1 | 7/2001 | Shaw et al. | |
| 6,268,695 B1 | 7/2001 | Affinito | |
| 6,274,204 B1 | 8/2001 | Affinito | |
| 6,322,860 B1 | 11/2001 | Stein et al. | |
| 6,333,065 B1 | 12/2001 | Arai et al. | |
| 6,348,237 B2 | 2/2002 | Kohler et al. | |
| 6,350,034 B1 | 2/2002 | Fleming et al. | |
| 6,352,777 B1 | 3/2002 | Bulovic et al. | |
| 6,358,570 B1 | 3/2002 | Affinito | |
| 6,361,885 B1 | 3/2002 | Chou | |
| 6,387,732 B1 | 5/2002 | Akram | |
| 6,397,776 B1 | 6/2002 | Yang et al. | |
| 6,413,645 B1 | 7/2002 | Graff et al. | |
| 6,416,872 B1 | 7/2002 | Maschwitz | |
| 6,420,003 B2 | 7/2002 | Shaw et al. | |
| 6,436,544 B1 | 8/2002 | Veyrat et al. | |
| 6,460,369 B2 | 10/2002 | Hosokawa | |
| 6,465,953 B1 | 10/2002 | Duggal | |
| 6,468,595 B1 | 10/2002 | Mikhael et al. | |
| 6,469,437 B1 | 10/2002 | Parthasarathy et al. | |
| 6,469,438 B2 | 10/2002 | Fukuoka et al. | |
| 6,495,953 B1 | 10/2002 | Duggal | |
| 6,492,026 B1 | 12/2002 | Graff et al. | |
| 6,497,598 B2 | 12/2002 | Affinito | |
| 6,497,924 B2 | 12/2002 | Affinito et al. | |
| 6,509,065 B2 | 1/2003 | Affinito | |
| 6,512,561 B1 | 1/2003 | Terashita et al. | |
| 6,522,067 B1 | 2/2003 | Graff et al. | |
| 6,537,688 B2 | 3/2003 | Silvernail et al. | |
| 6,544,600 B2 | 4/2003 | Affinito et al. | |
| 6,548,912 B1 | 4/2003 | Graff et al. | |
| 6,569,515 B2 | 5/2003 | Hebrink et al. | |
| 6,570,325 B2 | 5/2003 | Graff et al. | |
| 6,570,714 B2 | 5/2003 | Soane et al. | |
| 6,573,652 B1 | 6/2003 | Graff et al. | |
| 6,576,351 B2 | 6/2003 | Silvernail | |
| 6,592,969 B1 | 7/2003 | Burroughes et al. | |
| 6,597,111 B2 | 7/2003 | Silvernail et al. | |
| 6,613,395 B2 | 9/2003 | Affinito et al. | |
| 6,614,057 B2 | 9/2003 | Silvernail et al. | |
| 6,624,568 B2 | 9/2003 | Silvernail | |
| 6,627,267 B2 | 9/2003 | Affinito | |
| 6,628,071 B1 | 9/2003 | Su | |
| 6,653,780 B2 | 11/2003 | Sugimoto et al. | |
| 6,656,537 B2 | 12/2003 | Affinito et al. | |
| 6,660,409 B1 | 12/2003 | Komatsu et al. | |
| 6,664,137 B2 | 12/2003 | Weaver | |
| 6,681,716 B2 | 1/2004 | Schaepkens | |
| 6,710,542 B2 | 3/2004 | Chun et al. | |
| 6,720,203 B2 | 4/2004 | Carcia et al. | |
| 6,734,625 B2 | 5/2004 | Vong et al. | |
| 6,737,753 B2 | 5/2004 | Kumar et al. | |
| 6,743,524 B2 | 6/2004 | Schaepkens | |
| 6,749,940 B1 | 6/2004 | Terasaki et al. | |
| 6,765,351 B2 | 7/2004 | Forrest et al. | |
| 6,803,245 B2 | 10/2004 | Auch et al. | |
| 6,811,829 B2 | 11/2004 | Affinito et al. | |
| 6,815,887 B2 | 11/2004 | Lee et al. | |
| 6,818,291 B2 | 11/2004 | Funkenbusch et al. | |
| 6,822,391 B2 | 11/2004 | Yamazaki et al. | |
| 6,827,788 B2 | 12/2004 | Takahashi | |
| 6,835,950 B2 | 12/2004 | Brown et al. | |
| 6,836,070 B2 | 12/2004 | Chung et al. | |
| 6,837,950 B1 | 1/2005 | Berard | |
| 6,852,356 B2 | 2/2005 | Nishikawa | |
| 6,864,629 B2 | 3/2005 | Miyaguchi et al. | |
| 6,866,901 B2 * | 3/2005 | Burrows | H01L 23/564 257/28 |
| 6,867,539 B1 | 3/2005 | McCormick et al. | |
| 6,872,114 B2 | 3/2005 | Chung et al. | |
| 6,872,248 B2 | 3/2005 | Mizutani et al. | |
| 6,872,428 B2 | 3/2005 | Yang et al. | |
| 6,878,467 B2 | 4/2005 | Chung et al. | |
| 6,888,305 B2 | 5/2005 | Weaver | |
| 6,888,307 B2 | 5/2005 | Silvernail et al. | |
| 6,891,330 B2 | 5/2005 | Duggal et al. | |
| 6,897,474 B2 | 5/2005 | Brown et al. | |
| 6,897,607 B2 | 5/2005 | Sugimoto et al. | |
| 6,902,905 B2 | 6/2005 | Burson et al. | |
| 6,905,769 B2 | 6/2005 | Komada | |
| 6,911,667 B2 | 6/2005 | Pichler et al. | |
| 6,923,702 B2 | 8/2005 | Graff et al. | |
| 6,936,131 B2 | 8/2005 | McCormick et al. | |
| 6,975,067 B2 | 12/2005 | McCormick et al. | |
| 6,994,933 B1 | 2/2006 | Bates | |
| 6,998,648 B2 | 2/2006 | Silvernail | |
| 7,002,294 B2 | 2/2006 | Forrest et al. | |
| 7,012,363 B2 | 3/2006 | Weaver et al. | |
| 7,015,640 B2 | 3/2006 | Schaepkens et al. | |
| 7,018,713 B2 | 3/2006 | Padiyath et al. | |
| 7,029,765 B2 | 4/2006 | Kwong et al. | |
| 7,033,850 B2 | 4/2006 | Tyan et al. | |
| 7,056,584 B2 | 6/2006 | Iacovangelo | |
| 7,074,501 B2 | 7/2006 | Czeremuszkin et al. | |
| 7,086,918 B2 | 8/2006 | Hsiao et al. | |
| 7,112,351 B2 | 9/2006 | Affinito | |
| 7,122,418 B2 | 10/2006 | Su et al. | |
| 7,156,942 B2 | 1/2007 | McCormick et al. | |
| 7,166,007 B2 | 1/2007 | Auch et al. | |
| 7,183,197 B2 | 2/2007 | Won et al. | |
| 7,186,465 B2 | 3/2007 | Bright | |
| 7,198,832 B2 | 4/2007 | Burrows et al. | |
| 7,221,093 B2 | 5/2007 | Auch et al. | |
| 7,255,823 B1 | 8/2007 | Guenther et al. | |
| 7,298,072 B2 | 11/2007 | Czeremuszkin et al. | |
| 7,621,794 B2 | 11/2009 | Lee et al. | |
| 2001/0006827 A1 | 7/2001 | Yamazaki et al. | |
| 2001/0015074 A1 | 8/2001 | Hosokawa | |
| 2001/0015620 A1 | 8/2001 | Affinito | |
| 2001/0044035 A1 | 11/2001 | Morii | |
| 2002/0015818 A1 | 2/2002 | Takahashi et al. | |
| 2002/0022156 A1 | 2/2002 | Bright | |
| 2002/0025444 A1 | 2/2002 | Hebgrink et al. | |
| 2002/0068143 A1 | 6/2002 | Silvernail | |
| 2002/0069826 A1 | 6/2002 | Hunt et al. | |
| 2002/0102363 A1 | 8/2002 | Affinito et al. | |
| 2002/0102818 A1 | 8/2002 | Sandhu et al. | |
| 2002/0125822 A1 | 9/2002 | Graff et al. | |
| 2002/0139303 A1 | 10/2002 | Yamazaki et al. | |
| 2002/0140347 A1 | 10/2002 | Weaver | |
| 2003/0038590 A1 | 2/2003 | Silvernail et al. | |
| 2003/0045021 A1 | 3/2003 | Akai | |
| 2003/0085652 A1 | 5/2003 | Weaver | |
| 2003/0098647 A1 | 5/2003 | Silvernail et al. | |
| 2003/0117078 A1 | 6/2003 | Forrest et al. | |
| 2003/0124392 A1 | 7/2003 | Bright | |
| 2003/0127973 A1 | 7/2003 | Weaver et al. | |
| 2003/0134487 A1 | 7/2003 | Breen et al. | |
| 2003/0184222 A1 | 10/2003 | Nilsson et al. | |
| 2003/0197197 A1 | 10/2003 | Brown et al. | |

(56) References Cited

U.S. PATENT DOCUMENTS

| | | |
|---|---|---|
| 2003/0205845 A1 | 11/2003 | Pichler et al. |
| 2003/0218422 A1 | 11/2003 | Park et al. |
| 2003/0235648 A1 | 12/2003 | Affinito et al. |
| 2004/0002729 A1 | 1/2004 | Zamore |
| 2004/0014265 A1* | 1/2004 | Kazlas ............... B60C 23/04 438/200 |
| 2004/0018305 A1 | 1/2004 | Pagano et al. |
| 2004/0029334 A1 | 2/2004 | Bijker et al. |
| 2004/0031442 A1 | 2/2004 | Yamazaki et al. |
| 2004/0046497 A1 | 3/2004 | Schaepkens et al. |
| 2004/0071971 A1 | 4/2004 | Iacovangelo |
| 2004/0099926 A1 | 5/2004 | Yamazaki et al. |
| 2004/0113542 A1 | 6/2004 | Hsiao et al. |
| 2004/0115402 A1 | 6/2004 | Schaepkens |
| 2004/0115859 A1 | 6/2004 | Murayama et al. |
| 2004/0119028 A1 | 6/2004 | McCormick et al. |
| 2004/0175512 A1 | 9/2004 | Schaepkens |
| 2004/0175580 A1 | 9/2004 | Schaepkens |
| 2004/0187999 A1 | 9/2004 | Wilkinson et al. |
| 2004/0209090 A1 | 10/2004 | Iwanaga |
| 2004/0212759 A1 | 10/2004 | Hayashi |
| 2004/0219380 A1 | 11/2004 | Naruse et al. |
| 2004/0229051 A1 | 11/2004 | Schaepkens et al. |
| 2004/0241454 A1 | 12/2004 | Shaw et al. |
| 2004/0263038 A1 | 12/2004 | Ribolzi et al. |
| 2005/0003098 A1 | 1/2005 | Kohler et al. |
| 2005/0006786 A1 | 1/2005 | Sawada |
| 2005/0017633 A1* | 1/2005 | Miyadera ............ H05B 33/04 313/512 |
| 2005/0051094 A1 | 3/2005 | Schaepkens et al. |
| 2005/0079295 A1 | 4/2005 | Schaepkens |
| 2005/0079380 A1 | 4/2005 | Iwanaga |
| 2005/0093001 A1 | 5/2005 | Liu et al. |
| 2005/0093437 A1 | 5/2005 | Ouyang |
| 2005/0094394 A1 | 5/2005 | Padiyath et al. |
| 2005/0095422 A1 | 5/2005 | Sager et al. |
| 2005/0095736 A1 | 5/2005 | Padiyath et al. |
| 2005/0112378 A1 | 5/2005 | Naruse et al. |
| 2005/0115603 A1 | 6/2005 | Yoshida et al. |
| 2005/0122039 A1 | 6/2005 | Satani |
| 2005/0129841 A1 | 6/2005 | McCormick et al. |
| 2005/0133781 A1 | 6/2005 | Yan et al. |
| 2005/0140291 A1 | 6/2005 | Hirakata et al. |
| 2005/0146267 A1 | 7/2005 | Lee et al. |
| 2005/0162421 A1 | 7/2005 | Yamazaki et al. |
| 2005/0174045 A1 | 8/2005 | Lee et al. |
| 2005/0176181 A1 | 8/2005 | Burrows et al. |
| 2005/0202646 A1 | 9/2005 | Burrows et al. |
| 2005/0212419 A1 | 9/2005 | Vazan et al. |
| 2005/0224935 A1 | 10/2005 | Schaepkens et al. |
| 2005/0238846 A1 | 10/2005 | Arakatsu et al. |
| 2005/0239294 A1 | 10/2005 | Rosenblum et al. |
| 2006/0001040 A1 | 1/2006 | Kim et al. |
| 2006/0003474 A1 | 1/2006 | Tyan et al. |
| 2006/0006799 A1 | 1/2006 | Yamazaki et al. |
| 2006/0028128 A1 | 2/2006 | Ohkubo |
| 2006/0061272 A1 | 3/2006 | McCormick et al. |
| 2006/0062937 A1 | 3/2006 | Padiyath et al. |
| 2006/0063015 A1 | 3/2006 | McCormick et al. |
| 2006/0132461 A1 | 6/2006 | Furukawa et al. |
| 2006/0216951 A1 | 9/2006 | Moro et al. |
| 2006/0246811 A1 | 11/2006 | Winters et al. |
| 2006/0250084 A1 | 11/2006 | Cok et al. |
| 2006/0278333 A1* | 12/2006 | Lee .................. G02F 1/133305 156/263 |
| 2006/0291034 A1 | 12/2006 | Patry et al. |
| 2007/0009674 A1 | 1/2007 | Okubo et al. |
| 2007/0049155 A1 | 3/2007 | Moro et al. |
| 2007/0059854 A1* | 3/2007 | Huang ............. G02F 1/133305 438/30 |
| 2007/0164376 A1 | 7/2007 | Burrows et al. |
| 2007/0187759 A1 | 8/2007 | Lee et al. |
| 2007/0281089 A1 | 12/2007 | Heller et al. |
| 2008/0032076 A1 | 2/2008 | Dujardin et al. |
| 2009/0258235 A1 | 10/2009 | Tateishi |
| 2010/0193468 A1 | 8/2010 | Burrows et al. |

FOREIGN PATENT DOCUMENTS

| | | |
|---|---|---|
| CN | 1647247 A | 7/2005 |
| DE | 196 03 746 A1 | 4/1997 |
| DE | 696 15 510 T2 | 6/1997 |
| DE | 10 2004 063 619 A1 | 7/2006 |
| EP | 0 147 696 B1 | 7/1985 |
| EP | 0 299 753 A2 | 1/1989 |
| EP | 0 340 935 A2 | 11/1989 |
| EP | 0 390 540 B1 | 10/1990 |
| EP | 0 468 440 A2 | 1/1992 |
| EP | 0 547 550 A1 | 6/1993 |
| EP | 0 590 467 A1 | 4/1994 |
| EP | 0 611 037 A1 | 8/1994 |
| EP | 0 722 787 A2 | 7/1996 |
| EP | 0 777 280 A2 | 6/1997 |
| EP | 0 777 281 A2 | 6/1997 |
| EP | 0 787 824 A2 | 6/1997 |
| EP | 0 787 826 A1 | 6/1997 |
| EP | 0 915 105 A1 | 5/1998 |
| EP | 0 916 394 A2 | 5/1998 |
| EP | 0 931 850 A1 | 7/1999 |
| EP | 0 977 469 A2 | 2/2000 |
| EP | 1 021 070 A1 | 7/2000 |
| EP | 1 127 381 | 8/2001 |
| EP | 1 130 420 A2 | 9/2001 |
| EP | 1 278 244 A2 | 1/2003 |
| EP | 1426813 | 6/2004 |
| EP | 1514317 A1 | 3/2005 |
| EP | 1 719 808 A2 | 11/2006 |
| EP | 1 857 270 A1 | 11/2007 |
| GB | 2 210 826 A | 6/1989 |
| JP | S63-96895 | 4/1988 |
| JP | 63136316 | 8/1988 |
| JP | 6418441 | 1/1989 |
| JP | 01041067 | 2/1989 |
| JP | S64-41192 | 2/1989 |
| JP | 02183230 | 7/1990 |
| JP | 3-183759 | 8/1991 |
| JP | 03290375 | 12/1991 |
| JP | 4-14440 | 1/1992 |
| JP | 4-48515 | 2/1992 |
| JP | 04267097 | 9/1992 |
| JP | 06158305 | 11/1992 |
| JP | 05-217158 | 1/1993 |
| JP | 5501587 | 3/1993 |
| JP | 5-147678 | 6/1993 |
| JP | 05182759 | 7/1993 |
| JP | 5290972 | 11/1993 |
| JP | 06-136159 | 5/1994 |
| JP | 61-79644 | 6/1994 |
| JP | 06-196260 | 7/1994 |
| JP | 06-223966 | 8/1994 |
| JP | 6234186 A | 8/1994 |
| JP | 07-074378 | 3/1995 |
| JP | 07147189 | 6/1995 |
| JP | 07192866 | 7/1995 |
| JP | 8-72188 | 3/1996 |
| JP | 08171988 | 7/1996 |
| JP | 08179292 | 7/1996 |
| JP | 08-203669 | 8/1996 |
| JP | 08325713 | 10/1996 |
| JP | 8288522 A | 11/1996 |
| JP | 8-318590 | 12/1996 |
| JP | 09059763 | 4/1997 |
| JP | 09132774 | 5/1997 |
| JP | 9-161967 | 6/1997 |
| JP | 09161967 | 6/1997 |
| JP | 9-201897 | 8/1997 |
| JP | 09-232553 | 9/1997 |
| JP | 10-725 | 1/1998 |
| JP | 10-013083 | 1/1998 |
| JP | 10-016150 | 1/1998 |
| JP | 10312883 | 11/1998 |
| JP | 10-334744 | 12/1998 |

(56) References Cited

FOREIGN PATENT DOCUMENTS

| | | |
|---|---|---|
| JP | 11-017106 | 1/1999 |
| JP | 11040344 | 2/1999 |
| JP | 11-149826 | 6/1999 |
| JP | 11255923 | 9/1999 |
| JP | 200058258 | 2/2000 |
| JP | 2002/505969 | 2/2002 |
| JP | 2002-117973 | 4/2002 |
| JP | 2002-151254 | 5/2002 |
| JP | 2003-217845 | 7/2003 |
| JP | 2003-293122 A | 10/2003 |
| JP | 2003282239 | 10/2003 |
| JP | 2004186685 A | 7/2004 |
| JP | 2004-294601 | 10/2004 |
| JP | 2004-309932 | 11/2004 |
| JP | 2006330739 A | 5/2006 |
| JP | 2006-294780 | 10/2006 |
| JP | 2008-275737 | 11/2008 |
| WO | WO 87/07848 | 12/1987 |
| WO | WO 89/00337 | 1/1989 |
| WO | 91/07519 A1 | 5/1991 |
| WO | WO 95/10117 | 4/1995 |
| WO | WO 96/23217 | 8/1996 |
| WO | WO 97/04885 | 2/1997 |
| WO | WO 97/16053 | 5/1997 |
| WO | WO 97/22631 | 6/1997 |
| WO | WO 98/10116 | 3/1998 |
| WO | WO 98/18852 | 5/1998 |
| WO | WO 99/16557 | 4/1999 |
| WO | WO 99/16931 | 4/1999 |
| WO | 99/33651 A1 | 7/1999 |
| WO | WO 99/46120 | 9/1999 |
| WO | WO 00/26973 | 5/2000 |
| WO | WO 00/35603 | 6/2000 |
| WO | WO 00/35604 | 6/2000 |
| WO | WO 00/35993 | 6/2000 |
| WO | WO 00/36661 | 6/2000 |
| WO | WO 00/36665 | 6/2000 |
| WO | 00/53423 A1 | 9/2000 |
| WO | 0157904 A1 | 8/2001 |
| WO | WO 01/68360 | 9/2001 |
| WO | WO 01/81649 A1 | 11/2001 |
| WO | WO 01/82336 A2 | 11/2001 |
| WO | WO 01/82389 A1 | 11/2001 |
| WO | WO 01/87825 A1 | 11/2001 |
| WO | WO 01/89006 A1 | 11/2001 |
| WO | WO 02/26973 A1 | 4/2002 |
| WO | 02/051626 A1 | 7/2002 |
| WO | 02071506 A1 | 9/2002 |
| WO | WO 03/016589 A1 | 2/2003 |
| WO | WO03/090260 A2 | 10/2003 |
| WO | WO 03/098716 A1 | 11/2003 |
| WO | WO 03/098716 A1 | 11/2003 |
| WO | WO 2004/006199 A3 | 1/2004 |
| WO | WO 04/016992 A1 | 2/2004 |
| WO | WO 04/070840 A1 | 8/2004 |
| WO | WO 04/089620 A2 | 10/2004 |
| WO | 2004/112165 A1 | 12/2004 |
| WO | WO 05/015655 A1 | 2/2005 |
| WO | WO 05/045947 A2 | 5/2005 |
| WO | WO 05/048368 A1 | 5/2005 |
| WO | 2005050754 A1 | 6/2005 |
| WO | 2005/108215 A2 | 11/2005 |
| WO | WO 06/036492 A1 | 4/2006 |
| WO | 2006/093898 A1 | 9/2006 |
| WO | 2008097297 A2 | 8/2008 |
| WO | 2008097297 A3 | 8/2008 |
| WO | 2008097297 A9 | 8/2008 |
| WO | 2008/144080 A1 | 11/2008 |
| WO | 2008140313 A1 | 11/2008 |
| WO | 2008142645 A1 | 11/2008 |

OTHER PUBLICATIONS

Wong, C.P.; Recent Advances in IC Passivation and Encapsulation: Process Techniques and Materials; Polymers for Electronic and Photonic Applications; AT&T bell Laboratories; 1993; pp. 167-209.

Shi, M.K., et al., In-situ and real-time monitoring of plasma-induced etching PET and acrylic films, Plasma and Polymers, Dec. 1999, 4(4), pp. 1-25.

Affinito, J.D. et al.; Vacuum Deposited Polymer/Metal Multilayer Films for Optical Applications; Paper No. C1.13; International Conference on Metallurgical Coatings; Apr. 15-21, 1995; pp. 1-14.

Affinito, J.D. et al., "Vacuum Deposition of Polymer Electrolytes on Flexible Substrates" Proceedings of the Ninth International Conference on Vacuum Web Coating, Nov. 1995, ed R. Bakish, Bakish Press 1995, pp. 20-36.

PCT International Search Report regarding International application No. PCT/US 99/29853 dated Mar. 3, 2000.

Yializis A., et al., "Ultra High Barrier Films" 43$^{rd}$ Annual Technical Conference Proceedings, Denver, Apr. 15-20, 2000, pp. 404-407.

Henry, B.M. et al., "Microstructural and Gas Barrier Properties of Transparent Aluminum Oxide and Indium Tin Oxide Films" 43$^{rd}$ Annual Technical Conference Proceedings, Denver, Apr. 15-20, 2000, pp. 373-378.

Affinito, J.D. et al.; Vacuum Deposition of Polymer Electrolytes on Flexible Substrates; The Ninth International Conference on Vacuum Web Coating; 1995; pp. 0-16.

Norenberg, H. et al.; Comparative Study of Oxygen Permeation Through Polymers and Gas Barrier Films; 43$^{rd}$ Annual Technical Conference Proceedings; Denver, Apr. 15-20, 2000; pp. 347-351.

Mahon, J.K. et al.; Requirements of Flexible Substrates for Organic Light Emitting Devices in Flat Panel Display Applications; Society of Vacuum Coaters; 42$^{nd}$ Annual Technical Conference Proceedings; Apr. 1999; pp. 456-459.

Tropsha et al.; Activated Rate Theory Treatment of Oxygen and Water Transport through Silicon Oxide/Poly(ethylene terphthalate) Composite Barrier Structures; J. Phys. Chem B Mar. 1997; pp. 2259-2266.

Tropsha et al.; Combinatorial Barrier Effect of the Multilayer SiOx Coatings on Polymer Substrates; Society of Vacuum Coaters; 40$^{th}$ Annual Technical Conferences Proceedings; Apr. 12-17, 1997; pp. 64-69.

Affinito, J.D. et al.; Ultra High Rate, Wide Area, Plasma Polymerized Films from High Molecular Weight/Low Vapor Pressure Liquid or Solid Monomer Precursors; 45$^{th}$ International Symposium of the American Vacuum Society; Nov. 2-6, 1998; pp. 0-26.

Felts, J.T.; Transparent Barrier Coatings Update: Flexible Substrates; 36$^{th}$ Annual Technical Conference Proceedings; Apr. 25-30, 1993 pp. 324-331.

Affinito, J.D. et al.; Molecularly Doped Polymer Composite Films for Light Emitting Polymer Application Fabricated by the PML Process, 41$^{th}$ Technical Conference of the Society of Vacuum Coaters; Apr. 1998; pp. 220-225.

Affinito, J.D. et al.; Vacuum Deposited Conductive Polymer Films; The Eleventh International Conference on Vacuum Web Coating; Nov. 9-11, 1997; pp. 0-12.

Affinito, J.D. et al.; Polymer/Polymer, Polymer/Oxide, and Polymer/Metal Vacuum Deposited Interferences Filters; Tenth International Vacuum Web Coating Conference; Nov. 1996; pp. 0-14.

Kukla, R. et al.; Transparent Barrier Coatings with EB-Evaporation, an Update; Section Five; Transparent Barrier Coating Papers; Thirteenth International Conference on Vacuum Web Coatings; Oct. 17-19, 1999; pp. 222-233.

Bright, Clark I.; Transparent Barrier Coatings Based on ITO for Flexible Plastic Displays; Thirteenth International Conference on Vacuum Web Coatings; Oct. 17-19, 1999; pp. 247-255.

Henry, B.M. et al.; Microstructural Studies of Transparent Gas Barrier Coatings on Polymer Substrates; Thirteenth International Conference on Vacuum Web Coatings; Oct. 17-19, 1999; pp. 265-273.

Hibino, N. et al.; Transparent Barrier $Al_2O_3$ Coating by Activated Reactive Evaporation; Thirteenth International Conference on Vacuum Web Coatings; Oct. 17-19, 1999; pp. 234-245.

Shi, M.K. et al.; Plasma treatment of PET and acrylic coating surfaces-I. In situ XPS measurements; Journal of Adhesion Science and Technology; Mar. 2000, 14(12); pp. 1-28.

(56) References Cited

OTHER PUBLICATIONS

Affinito, J.D. et al.; "PML/Oxide/PML Barrier Layer Performance Differences Arising From Use of UV or Electron Beam Polymerization of the PML Layers;" SVC 40th Annual Technical Conference; Apr. 12-17, 1997; pp. 19-25.
Yializis, A. et al.; High Oxygen Barrier Polypropylene Films Using Transparent Acrylate-A$_2$0$_3$ and Opaque Al-Acrylate Coatings; 1995; pp. 95-102; Society of Vacuum Coaters.
Shaw, D.G. et al.; Use of Vapor Deposted Acrylate Coatings to Improve the Barrier Properties of Metallized Film; 1994; pp. 240-244; Society of Vacuum Coaters.
Affinito, J.D. et al.; "Vacuum Deposited Conductive Polymer Films" The Eleventh International Conference on Vacuum Web Coating, no earlier than Feb. 1998, pp. 200-213.
Bunshah, R.F. et al.; "Deposition Technologies for Films and Coatings" Noyes Publications, Park Ridge, New Jersey, 1982, p. 339.
Affinito, J.D.; Energy Res. Abstr. 18(6), #17171, 1993.
Atsuhisa Inoue, Maariko Ishino, Yoshiro Akagi and Yoshiharu Nakajima, Fabrication of a Thin Film of MNA by Vapour Deposition, Proc. of the 33rd Japan Conf. on Materials Research, U.33, p. 177-179, 1990.
Affinito, J.D. et al; Ultrahigh Rate, Wide Area, Plasma Polymerized Films from High Molecular Weight/Low Vapor Pressure Liquid or Solid Monomer Precursors; Journal Vacuum Science Technology A 17(4); Jul./Aug. 1999; pp. 1974-1982; American Vacuum Society.
Graupner, W. et al.; "High Resolution Color Organic Light Emitting Diode Microdisplay Fabrication Method", SPIE Proceedings; Nov. 6, 2000; pp. 11-19.
Czeremuszkin, G. et al.; Permeation Through Defects in Transparent Barrier Coated Plastic Alms; 43rd Annual Technical Conference Proceedings; Apr. 15, 2000; pp. 408-413.
Vossen, J.L. et al.; Thin Film Processes; Academic Press, 1978, Part II, Chapter 11-1, Glow Discharge Sputter Deposition, pp. 12-63; Part IV, Chapter IV-1 Plasma Deposition of Inorganic Compounds and Chapter IV-2 Glow Discharge Polymerization, pp. 335-397.
G. Gustafason, et al.; Flexible light-emitting diodes made from soluble conducting polymers; Letters to Nature; Vo. 357; Jun. 11, 1992; pp. 477-479.
F.M. Penning; Electrical Discharges in Gases; 1965; pp. 1-51; Gordon and Breach, Science Publishers, New York-London-Paris.
Affinito, J.D., et al.; High Rate Vacuum Deposition of Polymer Electrolytes; Journal Vacuum Science Technology A 14(3), May/Jun. 1996.
Phillips, R.W.; Evaporated Dielectric Colorless Films on PET and OPP Exhibiting High Barriers Toward Moisture and Oxygen; Society of Vacuum Coaters; 36th Annual Technical Conference Proceedings; 1993; pp. 293-301.
Yamada Y, et al.; The Properties of a New Transparent and Colorless Barrier Film; 1995; pp. 28-31; Society of Vacuum Coaters.
Chahroudi, D.; Transparent Glass Barrier Coatings for flexible Film Packaging; 1991; pp. 130-133; Society of Vacuum Coaters.
Krug, T. et al.; New Developments in Transparent Barrier Coatings; 1993; pp. 302-305; Society Vacuum Coaters.
Affinito, J.D. et al.; A new method for fabricating transparent barrier layers, Thin Solid Films 290-291; 1996; pp. 63-67.
Affinito, J.D. et al.; Polymer-Oxide Transparent Barrier Layers; SVC 39th Annual Technical Conference; Vacuum Web Coating Session; 1996; pp. 392-397.
Hoffman, G. et al.; Transparent Barrier Coatings by Reactive Evaporation; 1994; pp. 155-160; Society of Vacuum Coaters.
Kelmberg-Sapieha, J.E. et al.; Transparent Gas Barrier Coatings Produced by Dual-Frequency PECVD; 1993; pp. 445-449; Society of Vacuum Coaters.
Finson, E. et al.; Transparent SiO$_2$ Barrier Coatings: Conversion of Production Status; 1994; pp. 139-143; Society of Vacuum Coaters.
Affinito, J.D. et al; Ultra High Rate, Wide Area, Plasma Polymerized Films from High Molecular Weight/Low Vapor Pressure Liquid or Liquid/Solid Suspension Monomer Precursors; MRS Conference; Nov. 29, 1998-Dec. 3, 1998; Paper No. Y12.1.

Chwang et al, "Thin film encapsulated flexible organic electroluminescent displays." Applied Physics Letters, vol. 83, No, 3, Jul. 21, 2003, pp. 413-415.
Akedo et al, "Plasma-CVD SiNx/Plasma-Polymerized CNx:H Multilayer Passivation Films for Organic Light Emitting Diodes" Society of Information Display Digest of Technical Papers, vol. 34, No. 1, May 1, 2003, pp. 559-561.
Final Office Action dated Aug. 4, 2011 as it relates to U.S. Appl. No. 12/341,251.
Office Action dated Jun. 7, 2011 as it relates to U.S. Appl. No. 12/758,244.
Advisory Action dated Jul. 7, 2011 as it relates to U.S. Appl. No. 12/341,134.
Final Office Action dated Apr. 8, 2011 as it relates to U.S. Appl. No. 12/341,134.
Office Action dated Apr. 4, 2011 as it relates to U.S. Appl. No. 11/068,356.
Office Action pertaining to U.S. Appl. No. 12/758244 dated Jan. 20, 2011.
Office Action pertaining to U.S. Appl. No. 12/758,244 dated Jun. 7, 2011.
Office Action pertaining to U.S. Appl. No. 12/341,251 dated Feb. 17, 2011.
U.S. Office Action dated Sep. 28, 2010 pertaining to U.S. Appl. No. 12/341,134.
Young-Gu Lee et al., Thin Film Encapsulation of AMOLED Displays with Polyurea/Al203 Hybrid Multi-Layers, Reformable Display Group, Samsung Electronics, Paper, pp. 1457-1459 (IDW 2008).
Office Action dated Aug. 12, 2010 pertains to U.S. Appl. No. 12/758,244.
European Examination Report dated Mar. 25, 2010 pertaining to European Application No. 05 791 757.7.
Chinese Office Action dated Mar. 18, 2010 pertains to Chinese Appln. No. 200780018584.3.
U.S. Notice of Allowance dated Mar. 22, 2010 pertains to U.S. Appl. No. 11/509,837.
International Search Report/Written Opinion dated Apr. 1, 2010 pertains to U.S. International Appln. No. PCT/US2009/069788.
European Examination Report dated Mar. 5, 2010 pertains to European Appln. No. 07 865 280.7.
U.S. Office Action dated Apr. 29, 2010 pertains to U.S. Appl. No. 11/068,356.
U.S. Office Action dated Mar. 18, 2010 pertains to U.S. Appl. No. 12/345,912.
International Search Report and Written Opinion pertaining to International application No. PCT/US2009/060437 dated Feb. 17, 2010.
International Search Report and Written Opinion pertaining to International application No. PCT/US2009/066518 dated Feb. 15, 2010.
Japanese Office Action pertaining to Japanese Patent Application No. 2003-586919 dated Dec. 16, 2009.
Chinese Office Action pertaining to Chinese Patent Application No. 200580049572.8 dated Jan. 8, 2010.
Notice of Allowance pertaining to U.S. Appl. No. 11/693,022 dated Jan. 28, 2010.
Notice of Allowance dated Dec. 29, 2009 pertaining to U.S. Appl. No. 11/693,022.
Advisory Action dated Dec. 15, 2009 pertaining to U.S. Appl. No. 11/693,020.
Election/Restrictions Requirement dated Dec. 14, 2009 pertaining to U.S. Appl. No. 11/509,837.
Examiner's Answer dated Nov. 12, 2009 pertaining to U.S. Appl. No. 10/412,133.
Office Action dated Dec. 7, 2009 pertaining to U.S. Appl. No. 11/068,356.
Office Action dated Dec. 1, 2009 pertaining to U.S. Appl. No. 11/627,583.
Office Action of U.S. Appl. No. 11/693,020 dated Oct. 29, 2009.
Advisory Action of U.S. Appl. No. 10/412,133 dated Apr. 8, 2008.
Advisory Action of U.S. Appl. No. 10/412,133 dated Aug. 8, 2008.
Advisory Action of U.S. Appl. No. 11/112,880 dated Jul. 23, 2009.

(56) References Cited

OTHER PUBLICATIONS

Advisory Action of U.S. Appl. No. 11/693,022 dated Oct. 21, 2009.
Election/Restrictions Requirement of U.S. Appl. No. 10/412,133 dated Dec. 28, 2004.
Election/Restrictions Requirement of U.S. Appl. No. 11/112,880 dated Jul. 25, 2008.
Election/Restrictions Requirement of U.S. Appl. No. 11/693,020 dated Aug. 8, 2008.
Election/Restrictions Requirement of U.S. Appl. No. 11/693,022 dated Oct. 7, 2008.
Advisory Action of U.S. Appl. No. 11/068,356 dated Feb. 12, 2008.
Election/Restrictions Requirement of U.S. Appl. No. 11/693,020 dated Jun. 25, 2009.
Election/Restrictions Requirement of U.S. Appl. No. 11/509,837 dated Mar. 4, 2009.
Notice of Allowance of U.S. Appl. No. 11/776,616 dated Sep. 18, 2009.
Office Action of U.S. Appl. No. 11/693,022 dated Jan. 23, 2009.
Office Action of U.S. Appl. No. 10/412,133 dated Mar. 3, 2006.
Office Action of U.S. Appl. No. 10/412,133 dated Mar. 28, 2005.
Office Action of U.S. Appl. No. 11/112,880 dated May 28, 2009.
Advisory Action of U.S. Appl. No. 11/068,356 dated Mar. 30, 2009.
Office Action of U.S. Appl. No. 11/693,022 dated Aug. 18, 2009.
Office Action of U.S. Appl. No. 10/412,133 dated Sep. 5, 2007.
Office Action of U.S. Appl. No. 10/412,133 dated Sep. 7, 2006.
Office Action of U.S. Appl. No. 11/776,616 dated Sep. 26, 2008.
Office Action of U.S. Appl. No. 10/412,133 dated Nov. 3, 2005.
Office Action of U.S. Appl. No. 11/112,880 dated Dec. 3, 2008.
Office Action of U.S. Appl. No. 10/412,133 dated Dec. 11, 2007.
Office Action of U.S. Appl. No. 11/693,020 dated Dec. 30, 2008.
Election/Restrictions Requirement of U.S. Appl. No. 11/068,356 dated Oct. 17, 2008.
Office Action of U.S. Appl. No. 11/068,356 dated Jan. 22, 2009.
Office Action of U.S. Appl. No. 11/068,356 dated Apr. 4, 2008.
Office Action of U.S. Appl. No. 11/068,356 dated Jun. 10, 2009.
Office Action of U.S. Appl. No. 11/068,356 dated Jun. 15, 2007.
Office Action of U.S. Appl. No. 11/068,356 dated Nov. 28, 2007.
Office Action of U.S. Appl. No. 11/509,837 dated Jun. 30, 2009.
Election/Restrictions Requirement of U.S. Appl. No. 12/345,912 dated Oct. 27, 2009.
Wong, F.L., et al., "Long-lifetime thin-film encapsulated organic light-emitting diodes," Journal of Applied Physics pp. 014509-1-4 (2008).
International Search Report and Written Opinion dated Jun. 3, 2008 pertaining to International application No. PCT/US2007/086592.
Kim, Han-Ki et al., "Magnetic Field Shape Effect on Electrical Properties of TOLEDs in the Deposition of ITO Top Cathode Layer", Electrochemical and Solid-State Letters, 8 (12), (2005), pp. H103-H105.
Moro, L. et al, "Process and design of a multilayer thin film encapsulation of passive matrix OLED displays", Organic Light-Emitting Materials and Devices VII, Proceedings of SPIE vol. 5214, 2004, pp. 83-93.
Clark I. Bright, et al., Transparent Barrier Coatings Based on ITO for Flexible Plastic Displays, Oct. 17-19, 1999, pp. 247-264, Tucson, Arizona.

\* cited by examiner

METHOD OF ENCAPSULATING AN ENVIRONMENTALLY SENSITIVE DEVICE

CROSS-REFERENCE TO RELATED APPLICATIONS

This application is a divisional of U.S. patent application Ser. No. 11/627,602, filed Jan. 26, 2007, which is a continuation-in-part of U.S. application Ser. No. 11/068,356, filed Feb. 28, 2005, which is a divisional of U.S. application Ser. No. 09/966,163, filed Sep. 28, 2001, now U.S. Pat. No. 6,866,901, which is a continuation-in-part of U.S. application Ser. No. 09/427,138, filed Oct. 25, 1999, now U.S. Pat. No. 6,522,067, all of which are incorporated herein by reference.

BACKGROUND OF THE INVENTION

Many devices are subject to degradation caused by permeation of environmental gases or liquids, such as oxygen and water vapor in the atmosphere or chemicals used in the processing of the electronic product. The devices are usually encapsulated in order to prevent degradation.

Various types of encapsulated devices are known. For example, U.S. Pat. No. 6,268,695, entitled "Environmental Barrier Material For Organic Light Emitting Device And Method Of Making," issued Jul. 31, 2001; U.S. Pat. No. 6,522,067, entitled "Environmental Barrier Material For Organic Light Emitting Device And Method Of Making," issued Feb. 18, 2003; and U.S. Pat. No. 6,570,325, entitled "Environmental Barrier Material For Organic Light Emitting Device And Method Of Making", issued May 27, 2003, all of which are incorporated herein by reference, describe encapsulated organic light emitting devices (OLEDs). U.S. Pat. No. 6,573,652, entitled "Encapsulated Display Devices", issued Jun. 3, 2003, which is incorporated herein by reference, describes encapsulated liquid crystal displays (LCDs), light emitting diodes (LEDs), light emitting polymers (LEPs), electronic signage using electrophoretic inks, electroluminescent devices (EDs), and phosphorescent devices. U.S. Pat. No. 6,548,912, entitled "Semiconductor Passivation Using Barrier Coatings," issued Apr. 15, 2003, which is incorporated herein by reference, describes encapsulated microelectronic devices, including integrated circuits, charge coupled devices, light emitting diodes, light emitting polymers, organic light emitting devices, metal sensor pads, micro-disk lasers, electrochromic devices, photochromic devices, microelectromechanical systems, and solar cells.

Generally, encapsulated devices can be made by depositing barrier stacks adjacent to one or both sides of the device. The barrier stacks typically include at least one barrier layer and at least one decoupling layer. There could be one decoupling layer and one barrier layer, there could be multiple decoupling layers on one side of one or more barrier layers, or there could be one or more decoupling layers on both sides of one or more barrier layers. The important feature is that the barrier stack has at least one decoupling layer and at least one barrier layer.

One embodiment of an encapsulated display device is shown in FIG. 1. The encapsulated display device 100 includes a substrate 105, a display device 110, and a barrier stack 115. The barrier stack 115 includes a barrier layer 120 and a decoupling layer 125. The barrier stack 115 encapsulates the display device 110, preventing environmental oxygen and water vapor from degrading the display device.

The barrier layers and decoupling layers in the barrier stack can be made of the same material or of a different material. The barrier layers are typically about 100-1000 Å thick, and the decoupling layers are typically about 1000-10,000 Å thick.

Although only one barrier stack is shown in FIG. 1, the number of barrier stacks is not limited. The number of barrier stacks needed depends on the level of water vapor and oxygen permeation resistance needed for the particular application. One or two barrier stacks should provide sufficient barrier properties for many applications, and three or four barrier stacks should be sufficient for most. The most stringent applications may require five or more barrier stacks.

The barrier layers can be deposited using a vacuum process, such as sputtering, chemical vapor deposition, plasma enhanced chemical vapor deposition, evaporation, sublimation, electron cyclotron resonance-plasma enhanced vapor deposition (ECR-PECVD), and combinations thereof. Suitable barrier materials include, but are not limited to, metals, metal oxides, metal nitrides, metal carbides, metal oxynitrides, metal oxyborides, and combinations thereof. The barrier layers can be graded composition barriers, if desired. Suitable graded composition barriers include, but are not limited to, those described in U.S. Pat. No. 7,015,640, which is incorporated herein by reference.

The decoupling layers can be deposited using vacuum processes, such as flash evaporation with in situ polymerization under vacuum, or plasma deposition and polymerization, or atmospheric processes, such as spin coating, ink jet printing, screen printing, or spraying. Suitable materials for the decoupling layer, include, but are not limited to, organic polymers, inorganic polymers, organometallic polymers, hybrid organic/inorganic polymer systems, and silicates.

Handling flexible substrates as discrete sheets during the encapsulation of environmentally sensitive devices is difficult. The discrete sheets must be positioned correctly in relationship to the various pieces of equipment for depositing barriers, devices, etc. For example, many of the deposition steps utilize masks which must be positioned accurately and reproducibly with respect to the substrate to obtain the proper coverage. In order to maintain the correct position during processing, the discrete sheets need to rest on a rigid substrate or be held tightly by a clamping system. However, it is not easy to retain a polymeric sheet by mechanical clamping because of the plastic nature (e.g., flow and distortion under applied stress) of a flexible substrate. Furthermore, the encapsulation process imparts heat to a polymeric substrate, which has two adverse effects. Plastic flow leading to distortion increases significantly with heating of the film and may become catastrophic when the Tg is reached. Although the coefficient of thermal expansion (TCE) may not seem important, it is significant in an x-y plane when the dimensions are several inches by several inches. Both effects can cause a sheet of film which is initially tightly held at a temperature at the onset of processing to relax and distort as processing heats the film. In addition, another common system cannot be used with vacuum deposition processes. In that arrangement, the film is positioned on a rigid plate that has channels connected to a vacuum system, and a vacuum pump is used to establish a vacuum under the film at the contact of the film with the plate that holds the film in place. The film is held by the atmospheric pressure on the exposed surface of the film. However, this cannot be done in a vacuum environment.

In addition, the use of barriers on flexible substrates in roll form presents a significant issue. No matter how they are used as substrates for devices, the operation of cutting the substrate to an appropriate size for the finished device exposes the cut edges to the permeation of contaminants. The proposed solutions for this problem generally require additional, precision manufacturing steps, or result in a construction that sacrifices some or all of the advantages of the flexible substrate.

Therefore, there is a need for a method of handling discrete sheets during encapsulation of environmentally sensitive devices.

SUMMARY OF THE INVENTION

The present invention meets this need by providing a method of encapsulating an environmentally sensitive device. The method comprises providing a flexible substrate; cutting the flexible substrate into a discrete sheet; temporarily laminating the flexible substrate to a rigid support using a reversible adhesive; optionally applying a first barrier stack adjacent to the flexible substrate, the first barrier stack comprising at least one barrier layer and at least one decoupling layer; applying the environmentally sensitive device adjacent to the flexible substrate; applying a second barrier stack adjacent to the environmentally sensitive device, the second barrier stack comprising at least one barrier layer and at least one decoupling layer, the environmentally sensitive device being encapsulated between the substrate and the second barrier stack, the substrate and the second barrier stack forming a seal, or between the first barrier stack and the second barrier stack, the first and second barrier stacks forming a seal; and reversing the reversible adhesive and removing the encapsulated environmentally sensitive device from the rigid support.

In another embodiment, the method comprises providing a flexible substrate in discrete sheet form; temporarily laminating the flexible substrate adjacent to a rigid support; applying a first barrier stack adjacent to the flexible substrate, the first barrier stack comprising at least one barrier layer and at least one decoupling layer; applying the environmentally sensitive device adjacent to the flexible substrate; applying a sheet of barrier material adjacent to the environmentally sensitive device to encapsulate the environmentally sensitive device between the first barrier stack and the sheet of barrier material, the first barrier stack and the sheet of barrier material forming a seal; and removing the encapsulated environmentally sensitive device from the rigid support.

By adjacent to, we mean next to, but not necessarily directly next to. There can be additional layers between two adjacent layers.

DETAILED DESCRIPTION OF THE INVENTION

Figure 1:
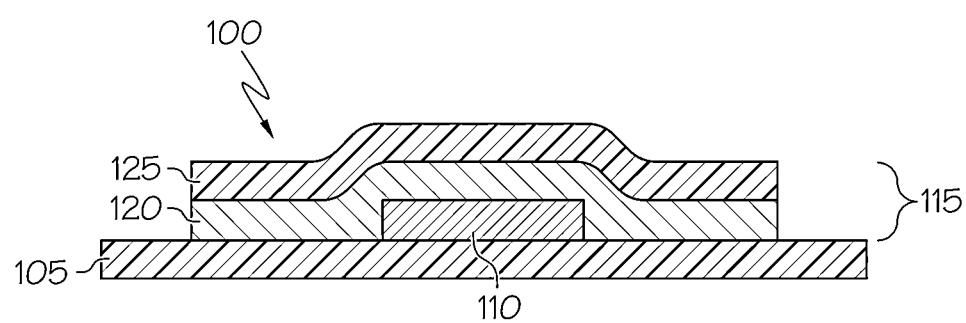
FIG. 1 is a diagram of an encapsulated environmentally sensitive device.

The present invention uses an easily reversible lamination to hold discrete sheets of the flexible substrate on the rigid support. This provides a construction which is more compatible with current fabrication processes and equipment for environmentally sensitive devices such as OLEDs. The temperature uniformity is as good as that for glass, which allows a uniform deposition of the monomer on the discrete sheet of flexible substrate. The invention also includes a solvent-free debonding process, avoiding the complications associated with the use of solvents.

One advantage of supporting flexible substrates on a rigid support is that the sheet of flexible substrate is positioned once on the rigid support and held by an adhesive which is effective in a vacuum environment. Clamping systems developed for rigid materials, such as glass coating technologies, silicon wafer technologies, printed circuit board technologies, chips, etc, processed in vacuum environments can be used. Precise placement means can also be used. Bonding the flexible film to a rigid support provides superior heat transfer between the film and the support, allowing the support to be a more effective heat sink for unwanted process heating. Although the flexible film still has a TCE, careful selection of the adhesives and rigid supports can level the differences and so the potential expansion related issues. In addition, the adhesive is a plastic by nature (i.e., it can flow and distort when heated) and can take up thermal expansions.

Generally, the process of the present invention includes providing a flexible substrate; cutting the flexible substrate into a discrete sheet; temporarily laminating the flexible substrate to a rigid support using a reversible adhesive; optionally applying a first barrier stack adjacent to the flexible substrate, the first barrier stack comprising at least one barrier layer and at least one decoupling layer; applying the environmentally sensitive device adjacent to the flexible substrate; applying a second barrier stack adjacent to the environmentally sensitive device, the second barrier stack comprising at least one barrier layer and at least one decoupling layer, the environmentally sensitive device being encapsulated between the substrate and the second barrier stack, the substrate and the second barrier stack forming a seal, or between the first barrier stack and the second barrier stack, the first and second barrier stacks forming a seal; and reversing the reversible adhesive and removing the encapsulated environmentally sensitive device from the rigid support.

Suitable flexible substrates include, but are not limited to, polymer films, metals, and metal foils.

The flexible substrate can include one or more functional layers. Suitable functional layers include, but are not limited to, planarizing layers, adhesion promoting layers, scratch resistant layers, organic or inorganic layers, anti-reflective coatings, anti-fingerprint coatings, anti-static coatings, electrically conductive layers, electrode layers, and combinations thereof.

The flexible substrate can include a first barrier stack, or a first barrier stack can be added during processing. The first barrier stack can be applied using a variety of approaches, including but not limited to, processes which create an edge seal. Suitable edge sealing processes are described in U.S. Pat. No. 6,866,901, which is incorporated herein by reference.

Where a discrete sheet is to carry an array of devices, the first barrier stack can be created as an array of appropriately dimensioned regions with sealed edges. Although the masking of such an array provides a significant challenge, it is viable given the established masking capability currently in existence.

Environmentally sensitive devices include, but are not limited to, organic light emitting devices, liquid crystal displays, displays using electrophoretic inks, light emitting diodes, light emitting polymers, electroluminescent devices, phosphorescent devices, electrophoretic inks, organic solar cells, inorganic solar cells, thin film batteries, thin film devices with vias, integrated circuits, charge coupled devices, metal sensor pads, micro-disk lasers, electrochromic devices, photochromic devices, microelectromechanical systems, and solar cells, and combinations thereof.

The environmentally sensitive device is sealed between the substrate and the second barrier stack, or between a first barrier stack and a second barrier stack, which encapsulate the environmentally sensitive device. The second barrier stack can be applied using various processes which form an edge seal.

Figure 2:
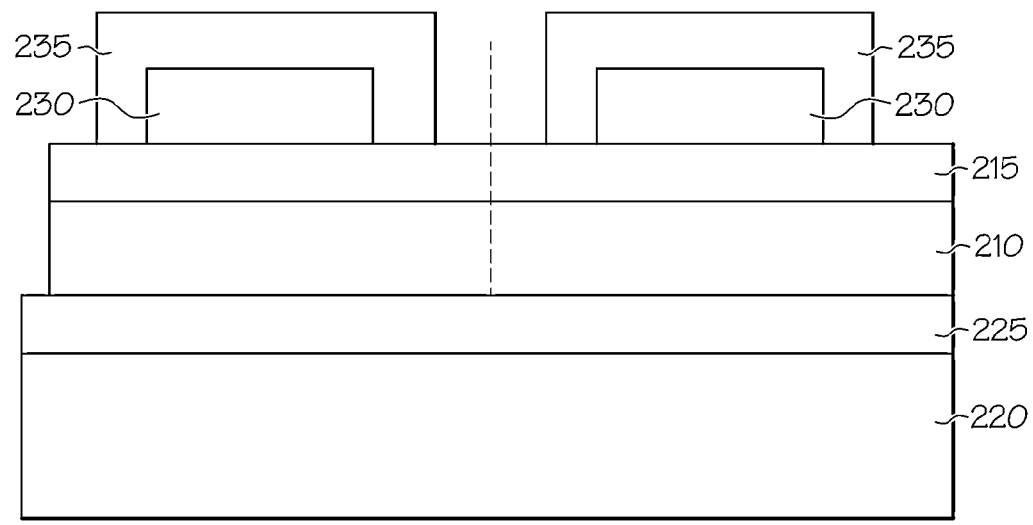
FIG. 2 is a diagram of an encapsulated environmentally sensitive device made according to one embodiment of the present invention.

FIG. 2 shows encapsulated devices made according to one embodiment of the present invention. The flexible substrate 210 has a pre-applied first barrier stack 215. The individual layers of the barrier stacks are not shown. The flexible substrate 210 with the barrier stack 215 is temporarily laminated adjacent to the rigid support 220 using a reversible adhesive 225. Suitable reversible adhesives include, but are not limited to, heat activated adhesives, pressure sensitive adhesives, ultra-violet (UV) activated adhesives, or combinations thereof.

Heat activated adhesives are heated to activate the adhesive and to reverse it. Suitable heat activated adhesives include, but are not limited to, polyamides, ethylene-vinyl alcohol copolymers, ethylene-vinyl acetate copolymers, hydrocarbon resins, acrylics, and acrylic copolymers. The heat activated adhesives can include additional components which can modify the properties, including control of activation temperature, tack, melt viscosity, thermal stability, and adhesion to specific substrates. The additional components can desirably be selected so that the adhesive is free of components that will become migratory in a vacuum environment. The adhesive is desirably applied under conditions that do not entrain excessive air.

Pressure sensitive adhesives are based on controlling the strength of adhesion so that the pressure sensitive adhesives can adhere a first substrate upon which they are emplaced to a surface of a second substrate via contact under pressure, but with limited strength of adhesion so that they will allow the first substrate to be removed from the second substrate when the removal force exceeds the adhesive strength. When properly formulated, they have significantly higher adhesion to the first substrate so that they remain anchored to the first substrate when it is removed. The pressure sensitive adhesive could be applied to the rigid support, which would allow the removal of the encapsulated device on a flexible substrate without the need to clean an adhesive layer from the flexible substrate. For example, a supply of rigid supports could be prepared with a pre-applied pressure sensitive adhesive and a release sheet to prevent debris from attaching to the adhesive surface. These rigid supports could be fed to a flexible substrate alignment and attachment station. A supply of pre-cut flexible film substrates, either with or without a device, could be fed to the alignment and attachment station, positioned, and contacted to make the laminate. This type of pick and place station and process is used for placing chips onto boards.

UV activated adhesives provide an adhesive surface as applied. This allows the flexible substrate to be adhered to the rigid support. UV exposure results in loss of adhesion and therefore, release of the flexible substrate. Differing mechanisms can provide this result. One is to incorporate a component into the coating formulation that degrades in response to UV exposure thereby reducing and/or eliminating the adhesive properties of the coating. The other is to include a component in the coating that undergoes considerable cross-linking (polymerization) in response to UV exposure. Cross-linking and shrinkage accompanying cross-linking often result in a reduction in adhesion when the mechanisms involved do not include reacting with the surfaces in contact with the cross-linked coating. When initially applied, the coating has adhesive properties, but when exposed to UV radiation, cross-linking occurs, resulting in a loss of adhesive properties.

Another consideration is application method. One common approach involves heating the adhesive to form a melt that can be coated and "frozen" in place. An alternative is to dissolve the adhesive composition in a solvent and apply the mixture using conventional atmospheric coating processes. This process has the advantage of a superior ability to control the amount and uniformity of the adhesive deposited. It is also possible using conventional coating processes to apply adhesives as a blend of precursors that are reacted (partially cross-linked) after application to form an adhesive layer. Pressure sensitive acrylic and urethane based adhesives are commonly applied using this approach. Blends of reactive precursors can be essentially 100% solids. If the components are selected with low vapor pressures, they could be applied in a vacuum, if desired. Alternatively, they can be combined with a solvent for ease of application, and the solvent can be removed by evaporation after application and prior to initiation of the cure. The latter approach typically uses oligomeric components that are self-cross-linking to avoid issues with azeotropes formed between low molecular weight precursors and the solvent(s) used for coating.

Another consideration is the surface to be coated with the reversible adhesive. It is significantly easier to coat a web than a discrete sheet. However, handling barrier coated films requires particular care to avoid damage, accumulated debris, or premature exposure to environmental contaminants. Therefore, it may be desirable to apply the adhesive to the rigid support, helping to minimize handling of the barrier coated film.

The environmentally sensitive devices 230 are then applied adjacent to the first barrier stack 215 on the flexible substrate 210. The environmentally sensitive device can be applied by direct deposition, or it can be fabricated first and then placed adjacent to the first barrier stack.

A second barrier stack 235, which includes an edge seal, is applied adjacent to the environmentally sensitive devices 230, which are sealed between the first barrier stack 215 and the second barrier stack 235.

After the environmentally sensitive devices 230 are encapsulated, the adhesive 225 is reversed using a method appropriate to the type of reversible adhesive.

The individual encapsulated environmentally sensitive devices can be separated by cutting the flexible support 210 and first barrier stack 215. However, cutting through the first barrier stack can expose the various layers of the first barrier stack to contaminants.

Figure 3:
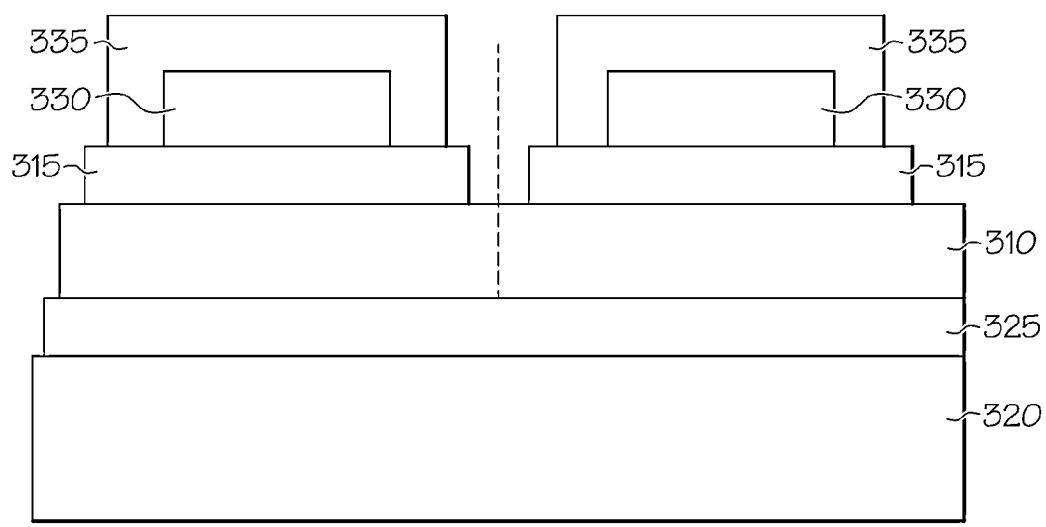
FIG. 3 is a diagram of an encapsulated environmentally sensitive device made according to another embodiment of the present invention.

Another method of making encapsulated environmentally sensitive devices is shown in FIG. 3. In this case, the flexible substrate 310 is temporarily laminated to the rigid support 320 using a reversible adhesive 325. The first barrier stack 315, which includes an edge seal, is applied after the flexible substrate 310 has been laminated adjacent to the rigid support 320. The individual layers of the barrier stacks are not shown. The first barrier stack 315 is applied over discrete areas of the flexible support 310, using masks, for example. The environmentally sensitive device 330 is encapsulated by the second barrier stack 335, which has an edge seal. The adhesive 325 can be reversed, and the rigid support 320 removed.

The individual encapsulated environmentally sensitive devices can be separated by cutting through the flexible substrate 310. In this embodiment, because the first barrier stack 315 was applied over discrete areas of the flexible substrate 310, the individual encapsulated environmentally sensitive devices can be separated without cutting through the first barrier stack 315. This avoids the damage that is often noted when barrier stack assemblies are cut.

Figure 4:
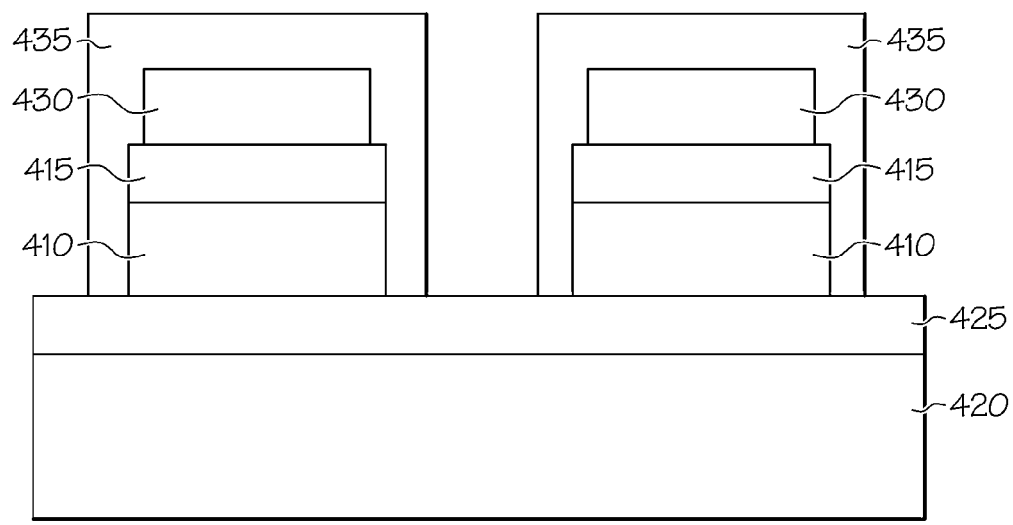
FIG. 4 is a diagram of an encapsulated environmentally sensitive device made according to another embodiment of the present invention.

FIG. 4 shows another method of making encapsulated environmentally sensitive devices. The flexible substrate 410 has a pre-applied first barrier stack 415. The individual layers of the barrier stacks are not shown. The flexible substrate 410 is cut into discrete sheets with dimensions appropriate to the environmentally sensitive device 430 to be applied. The discrete sheets of the flexible substrate 410 with the pre-applied first barrier stack 415 are temporarily laminated adjacent to the rigid support 420 with the reversible adhesive 425. The environmentally sensitive device 430 is applied adjacent to the first barrier stack 415, and encapsulated by the second barrier stack 435, which includes an edge seal. The adhesive can be reversed, and the rigid support 420 removed. The individual encapsulated environmentally sensitive devices are separated by the removal of the rigid support 420; separation does not require cutting. This approach allows the creation of an edge seal for the barrier stack edges exposed when the flexible substrate 410 and first barrier stack 415 were cut into discrete sheets.

The adhesive layer 425 can be replaced after each cycle, if desired. This helps to eliminate problems with contaminants and debris becoming trapped in the adhesive.

Figure 5:
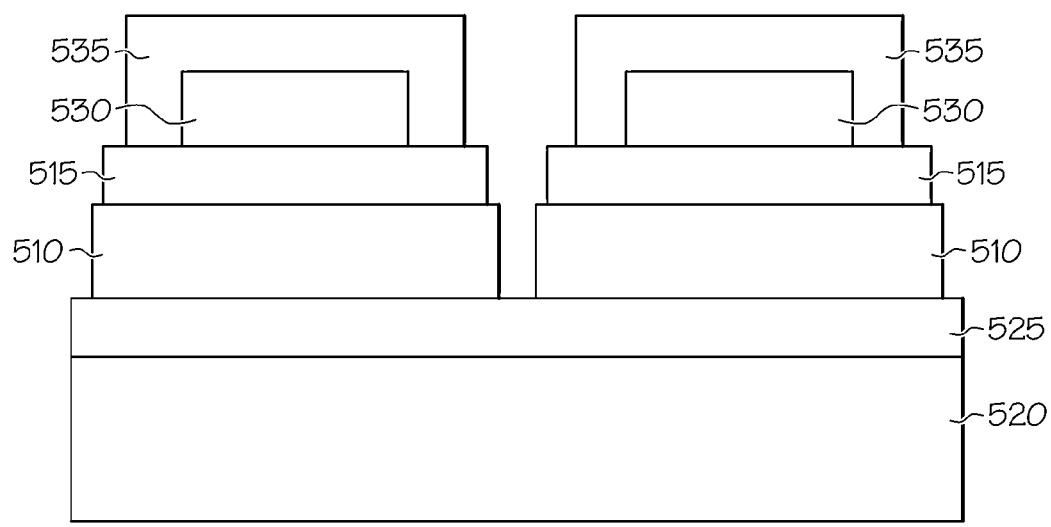
FIG. 5 is a diagram of an encapsulated environmentally sensitive device made according to another embodiment of the present invention.

Another method is shown in FIG. 5. In this arrangement, the flexible support 510 is cut into discrete sheets having an appropriate size for environmentally sensitive device 530. The discrete sheets of the flexible substrate 510 are temporarily laminated to the rigid support 520 with the reversible adhesive 525. The first barrier stack 515, which has an edge seal, is deposited adjacent to the flexible substrate 510. The individual layers of the barrier stacks are not shown. The environmentally sensitive device 530 is fabricated adjacent to the first barrier stack 515, and the second barrier stack 535, which has an edge seal, encapsulates it. The adhesive 525 is reversed, and the rigid support 520 removed. The removal of the rigid support 520 separates the individual encapsulated environmentally sensitive devices; no cutting is necessary.

Figure 6:
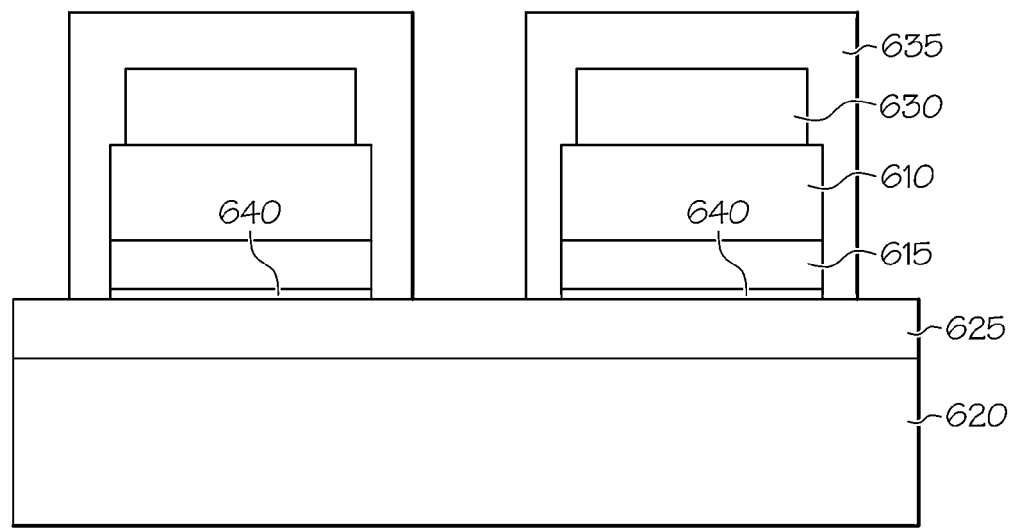
FIG. 6 is a diagram of an encapsulated environmentally sensitive device made according to another embodiment of the present invention.

Still another method is shown in FIG. 6. The flexible support 610 has a pre-applied barrier stack 615. The flexible support 610 is cut into discrete sheets sized for the environmentally sensitive device 630. The flexible substrate 610 with the barrier stack 615 is temporarily laminated to the rigid support 620 using a reversible adhesive 625. The individual layers of the barrier stacks are not shown. In this arrangement, the barrier stack 615 faces the adhesive 625, rather than the flexible substrate 610 facing the adhesive 625. An optional functional layer 640, such as a scratch resistant layer, can be included over the barrier stack 615 and would serve as the interface between the barrier stack 615 and the adhesive 625. The environmentally sensitive device 630 is fabricated adjacent to the flexible support 610, and is encapsulated by the second barrier stack 635, which has an edge seal. This arrangement allows the second barrier stack 635 to protect the edges of the first barrier stack 615 which were exposed when the flexible substrate 610 and first barrier stack 615 were cut into discrete sheets.

Figure 7:
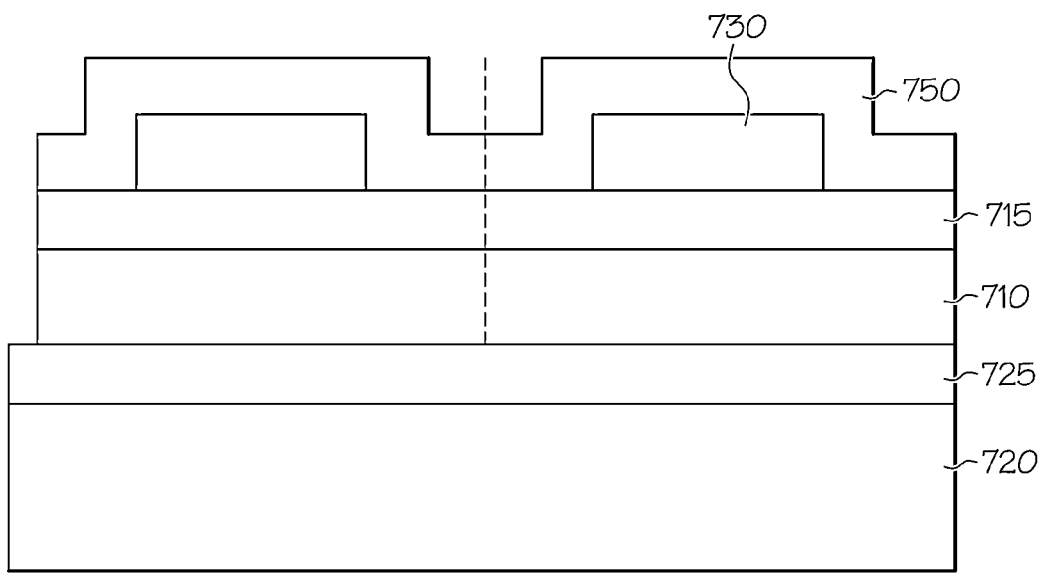
FIG. 7 is a diagram of an encapsulated environmentally sensitive device made according to another embodiment of the present invention.
Figure 8:
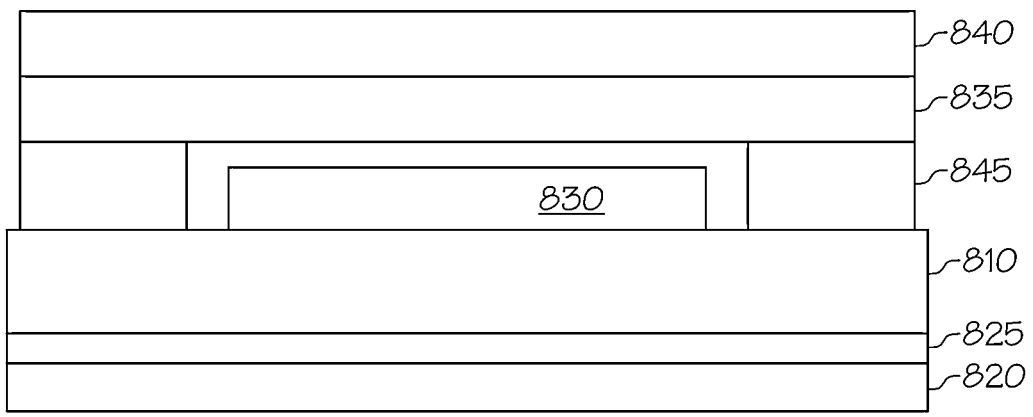
FIG. 8 is a diagram of an encapsulated environmentally sensitive device made according to another embodiment of the present invention.

Alternatively in FIGS. 2-6, the second barrier could be a sheet of a barrier material, such as a sheet of a metal or metal foil, which can be laminated over the environmentally sensitive device. FIG. 7 shows another method of making encapsulated environmentally sensitive devices. In this arrangement, the flexible substrate 710 includes a pre-applied three dimensional barrier 745. The flexible substrate 710 is temporarily laminated to the rigid support 720 using a reversible adhesive 725. The environmentally sensitive device 730 is fabricated adjacent to the flexible support 710. A second three dimensional barrier 750 encapsulates the environmentally sensitive device 730. The adhesive 725 can be reversed, and the rigid support 720 removed. The flexible substrate 710 can be cut to separate the individual encapsulated environmentally sensitive devices. One advantage of the three dimensional first and second barriers is that cutting the barriers does not compromise the barrier. A method of making a three dimensional barrier is described in U.S. application Ser. No. 11/627,583, filed concurrently herewith, entitled "Three Dimensional Multilayer Barrier and Method of Making", which is incorporated by reference herein. Another method is shown in FIG. 8. In this embodiment, there is no barrier stack on the flexible substrate 810. For example, the flexible substrate could be a metal or metal foil. The flexible substrate 810 is temporarily laminated to the rigid support 820 using reversible adhesive 825. A second barrier stack 835 is applied adjacent to the environmentally sensitive device 830. The second barrier stack 835 can be applied by laminating a flexible film 840 with a pre-applied second barrier 835 using an adhesive 845. Other methods of lamination could be used including, but not limited to, using heat. A gettering material could be included between the adhesive 845 and the environmentally sensitive device 830.

A cover sheet could be laminated to an array of environmentally sensitive devices. The adhesive/sealant (and optional getter) could be patterned to surround each of the array of devices on the flexible substrate using a mask or a printing technique such as ink jet. Another method is the use of a layer of adhesive/sealant applied to the entire surface (the devices as well as the area between devices). A third method is to use pick and place equipment to apply individual covers to each of the devices. In this case, the adhesive/sealant could be applied as described in either of the first two approaches.

Alternatively, the second barrier 835 could be deposited adjacent to the environmentally sensitive device 830 using vacuum or atmospheric processes. In this case, the flexible film 840 and adhesive 845 would not be used.

Figure 9:
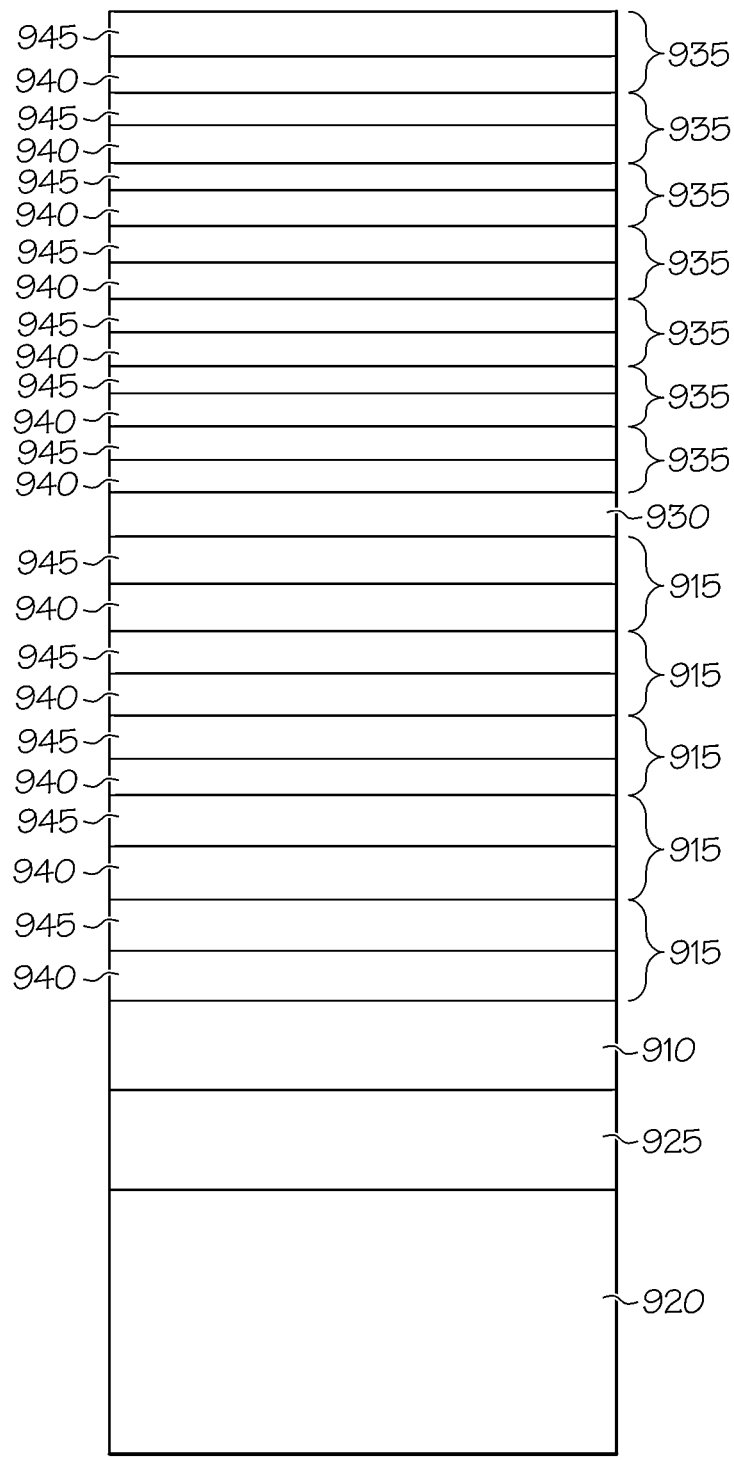
FIG. 9 is a diagram of the structure of one embodiment of the first and second barrier stacks of the present invention.

There can be one or more first and/or second barrier stacks. The barrier stacks can include at least one decoupling layer and at least one barrier layer. For example, a suitable arrangement for the encapsulated environmentally sensitive device is shown in FIG. 9. The flexible substrate 910 is temporarily laminated to the rigid support 920 using a reversible adhesive 925. First barrier stacks 915 are adjacent to the flexible substrate 910. The environmentally sensitive device 930 is adjacent to the first barrier stacks 915. The second barrier stacks 935 are adjacent to the environmentally sensitive device 930. The first and second barrier stacks 915, 935 are made of alternating decoupling layers 940 and barrier layers 945. There are five first barrier stacks 915 of alternating decoupling layers and barrier layers, and seven second barrier stacks 935. In the second barrier stacks 935, the barrier layer adjacent to the environmentally sensitive device can be thicker than the other barrier layers, and the last decoupling layer (the top layer) can be thicker than the other decoupling layers, if desired. FIG. 9 shows only the order of the various layers; it does not show the edge seals for the barrier stacks.

Example 1

Figure 10:
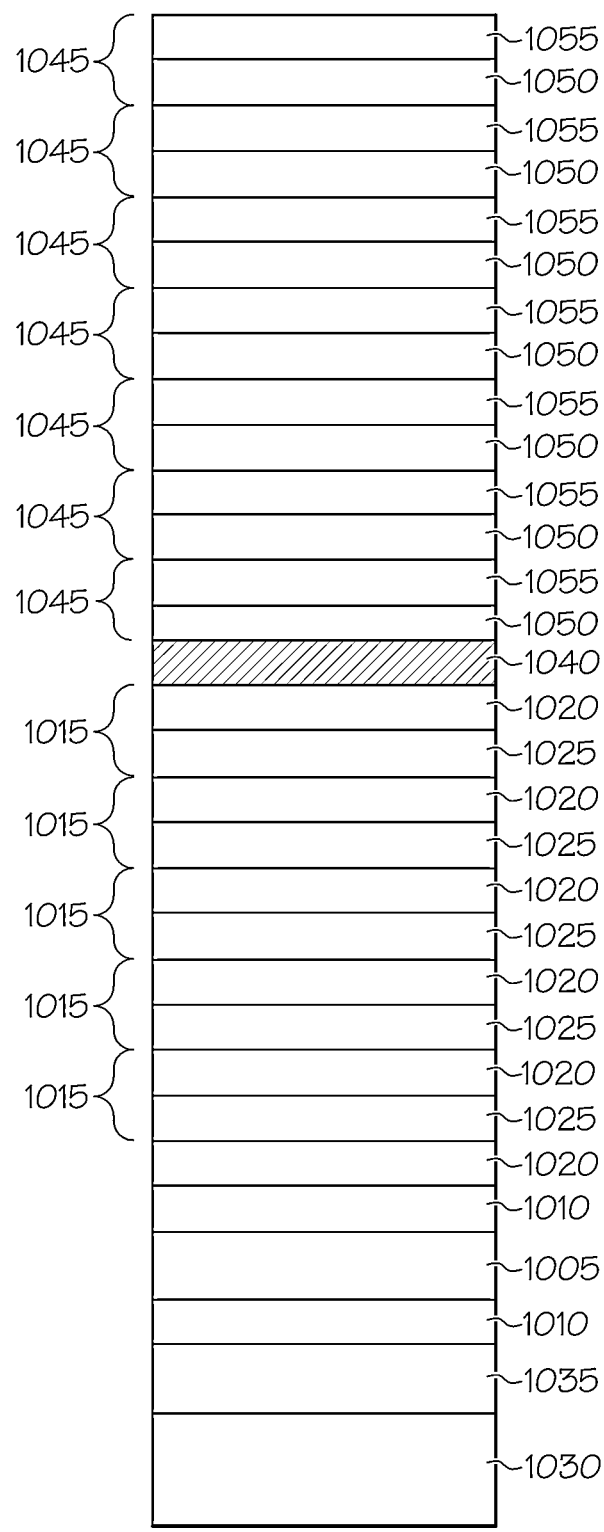
FIG. 10 is a diagram of the structure of one embodiment of the first and second barrier stacks of the present invention.

FIG. 10 shows one embodiment of a structure which was tested. The flexible substrate 1005 was polyethylene naphthenate. It had a hard coat layer (SDC Technology, crystal coat MP 101) 1010 on both sides. It also had pre-applied barrier stacks 1015 containing 5 sets of alternating layers of aluminum oxide 1020 and acrylate polymer 1025 and an additional aluminum oxide layer 1020. The flexible substrate and barrier stacks were temporarily laminated to the rigid glass support 1030 using a reversible adhesive (3M 668 Thermo Bond) 1035. A layer of calcium 1040, which is used to test barrier performance, was then deposited over the first barrier stacks 1015. The calcium test is described in Nisato et al., "Thin Film Encapsulation for OLEDs: Evaluation of Multi-layer Barriers using the Ca Test," SID 03 Digest, 2003, p. 550-553, which is incorporated herein by reference. The second barrier stacks 1045 were then deposited. The second barrier stacks were 7 sets of alternating layers of aluminum oxide 1050 and acrylate polymer 1055. The first oxide layer (adjacent to the layer of calcium 1040) and the last polymer layer (the top layer) were thicker than the remaining layers. These samples had rather short lifetimes, typically about 25 hours at 60° C. and 90% RH. The best results were about 100 hours, but there was significant damage to the barrier coated flexible substrate.

The experiment was repeated by laminating the flexible substrate with the pre-applied barrier stacks to the rigid glass support. Three layers, a fast process aluminum oxide, acrylate polymer, and aluminum oxide were deposited on the barrier stacks prior to deposition and encapsulation of the Ca test patch. This was done to solve issues which were believed to be due to debris from shipping and/or handling of the flexible substrate and barrier stacks. This experiment showed excellent results, with about 90% of the Ca samples passing after 500 hours at 60° C. and 90% RH.

While certain representative embodiments and details have been shown for purposes of illustrating the invention, it will be apparent to those skilled in the art that various changes in the compositions and methods disclosed herein may be made without departing from the scope of the invention, which is defined in the appended claims.

What is claimed is:

1. A method of encapsulating environmentally sensitive devices, the method comprising:
providing a flexible substrate;
temporarily laminating the flexible substrate adjacent to a rigid support with a reversible adhesive;
masking regions on the flexible substrate to define areas corresponding to first barrier stacks;
applying the first barrier stacks adjacent to the flexible substrate after the flexible substrate is laminated adjacent to the rigid support, each of the first barrier stacks comprising at least one barrier layer and at least one decoupling layer;
applying the environmentally sensitive devices over the flexible substrate such that the environmentally sensitive devices are formed adjacent to the first barrier stacks;
applying second barrier stacks adjacent to the environmentally sensitive devices, each of the second barrier stacks comprising at least one barrier layer and at least one decoupling layer such that an edge seal is formed by each of the second barrier stacks about each of the edges of the environmentally sensitive devices, each of the environmentally sensitive devices being encapsulated between a corresponding first barrier stack and a corresponding second barrier stack;
removing the flexible substrate from the rigid support by decoupling the adhesive; and
cutting the flexible substrate between the defined areas after such removing.

2. The method of claim 1 wherein the flexible substrate is cut into discrete sheet form after the flexible substrate is laminated adjacent to the rigid support.

3. The method of claim 1 wherein the flexible substrate is cut into discrete sheet form and wherein the first barrier stacks are applied before the flexible substrate is cut into the discrete sheet form.

4. The method of claim 1 wherein the first barrier stacks are applied using a mask.

5. The method of claim 1 wherein the second barrier stacks are applied using a mask.

6. The method of claim 1 further comprising applying a functional layer adjacent to the flexible substrate.

7. The method of claim 1 wherein applying second barrier stacks adjacent to the environmentally sensitive devices comprises depositing the second barrier stacks adjacent to the environmentally sensitive devices.

8. The method of claim 7 wherein depositing the second barrier stacks adjacent to the environmentally sensitive devices comprises vacuum depositing the second barrier stacks adjacent to the environmentally sensitive devices.

9. The method of claim 7 wherein the second barrier stacks are laminated adjacent to the environmentally sensitive devices using heat, adhesive, or combinations thereof.

10. The method of claim 1 wherein applying second barrier stacks adjacent to the environmentally sensitive devices comprises laminating the second barrier stacks adjacent to the environmentally sensitive devices.

11. The method of claim 1 further comprising applying an array of thin film transistors before the environmentally sensitive devices are applied.

* * * * *